(12) United States Patent
Kim et al.

(10) Patent No.: US 7,548,449 B2
(45) Date of Patent: Jun. 16, 2009

(54) MAGNETIC MEMORY DEVICE AND METHODS THEREOF

(75) Inventors: Tae-Wan Kim, Yongin-si (KR); In-Jun Hwang, Yongin-si (KR); Young-Jin Cho, Suwon-si (KR); Kee-Won Kim, Yongin-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 12 days.

(21) Appl. No.: 11/655,192

(22) Filed: Jan. 19, 2007

(65) Prior Publication Data

US 2007/0195586 A1  Aug. 23, 2007

(30) Foreign Application Priority Data

Feb. 22, 2006  (KR) .................. 10-2006-0017028

(51) Int. Cl.
*G11C 11/00*  (2006.01)
(52) U.S. Cl. .................. 365/158; 365/171; 365/46; 365/55; 365/97; 365/100
(58) Field of Classification Search ............. 365/171, 365/158, 46, 55, 75, 97, 100
See application file for complete search history.

(56) References Cited

U.S. PATENT DOCUMENTS

| 5,734,605 | A | 3/1998 | Zhu et al. | |
| 6,621,730 | B1 | 9/2003 | Lage | |
| 2004/0047196 | A1* | 3/2004 | Hidaka | 365/200 |
| 2005/0073897 | A1* | 4/2005 | Miyatake et al. | 365/222 |
| 2007/0076469 | A1* | 4/2007 | Ashida et al. | 365/158 |
| 2007/0097730 | A1* | 5/2007 | Chen et al. | 365/158 |

FOREIGN PATENT DOCUMENTS

| JP | WO 03/052828 | 6/2003 |
| KR | 10-2004-0066420 A | 7/2004 |

OTHER PUBLICATIONS

Korean Office Action dated Apr. 23, 2007.
European Search Report dated Jun. 18, 2007 for corresponding European Application No. 06121148.8, including Abstract.

* cited by examiner

*Primary Examiner*—Huan Hoang
*Assistant Examiner*—Fernando N Hidalgo
(74) *Attorney, Agent, or Firm*—Harness, Dickey & Pierce, PLC

(57) ABSTRACT

A magnetic memory device and methods thereof are provided. The example magnetic memory device may include a transistor disposed within a given unit cell region and a magnetic tunneling junction (MTJ) element connected to the transistor, the MTJ element including an MTJ cell and first and second pad layers forming a magnetic field at first and second ends of the MTJ cell, the transistor including a drain connected to the first pad layer in the given unit cell region and a bit line, a source connected to the second pad layer in an adjacent unit cell region, and a gate connected to a word line corresponding to the given unit cell region. A first example method may include writing data into a MTJ element by polarizing a selected memory region connected to a word line, a first magnetic field at a first end of the MTJ element controlled by a first transistor corresponding to the selected memory region and a second magnetic field at a second end of the MTJ element controlled by a second transistor associated with an adjacent MJT element, the adjacent MJT element connected to the same word line as the MJT element. A second example method may include applying a first current to a first portion of a MTJ element on a first path from a word line to the MTJ element and applying a second current to a second portion of the MTJ element on a second path from the word line to the MTJ element, each of the first and second currents lower than a current threshold, the current threshold being a minimum current for initiating a polarization of the MTJ element, and a sum of the first and second currents at least equal to the current threshold.

10 Claims, 6 Drawing Sheets

MAGNETIC MEMORY DEVICE AND METHODS THEREOF

PRIORITY STATEMENT

This application claims the benefit of Korean Patent Application No. 10-2006-0017028, filed on Feb. 22, 2006, in the Korean Intellectual Property Office, the disclosure of which is incorporated herein in its entirety by reference.

BACKGROUND OF THE INVENTION

1. Field of the Invention

Example embodiments of the present invention relate generally to a magnetic memory device and methods thereof, and more particularly to a magnetic memory device and methods of writing data into the magnetic memory device.

2. Description of the Related Art

Magnetic memory devices may include a magnetic tunneling junction (MTJ) cell having a tunneling layer as a storage node and magnetic layers disposed above and below the tunneling layer. Conventional magnetic memory devices may be nonvolatile memory devices which write bit data using a resistance characteristic of the MTJ cell.

The MTJ cell may have lower resistance if magnetization directions of magnetic layers of the MTJ cell are the same. In contrast, the MTJ cell may have higher resistance if magnetization directions of the magnetic layers not the same. If the MTJ cell is determined to have a lower resistance, the MJT cell may correspond to a first logic level (e.g., a higher logic level or logic "1"). If the MTJ cell is determined to have a higher resistance, the MJT cell may correspond to a second logic level (e.g., a lower logic level or logic "0"). Accordingly, bit data written into a conventional magnetic memory device may be read by measuring resistance or current of the MTJ cell and by comparing the resistance or current with a reference value.

FIG. 1 is a cross-sectional view illustrating a conventional magnetic memory device. Referring to FIG. 1, a gate electrode G may be disposed on a semiconductor substrate 10. Source and drain regions S and D may be respectively formed on the semiconductor substrate 10 between the gate electrode G and two field oxide layers (not shown) adjacent to the gate electrode G. The gate electrode G, and the source and drain regions S and D may collectively constitute a "field effect transistor" (hereinafter, referred to as a "transistor"). A digital line DL may be positioned at a given offset from the gate electrode G. A portion of a magnetic field used during a write operation of the conventional magnetic memory device (e.g., a random access memory (RAM) device) may be formed by the digit line DL. The digit line DL and the transistor may be covered with an interlevel dielectric (ILD) layer 12. A via hole h1 may be positioned in the ILD layer 12, and the via hole h1 may be filled with a conductive plug 14. A conductive pad 16 may also be positioned in the ILD layer 12. The conductive pad 16 may cover an upper surface of the conductive plug 14 and may extend up to the digit line DL by a given length. A MTJ cell 18 may be disposed on a given region of the conductive pad 16, such as on the digit line DL. An ILD layer 20 covering the conductive pad 16 and the MTJ cell 18 may further be positioned on the ILD layer 12. A via hole h2, through which an upper surface of the MTJ cell 18 is exposed, may be formed in the ILD layer 12. A bit line 22 filling the via hole h2 may further be positioned on the ILD layer 12.

FIG. 2 illustrates a flow of current in write and read operations of the conventional magnetic memory device of FIG. 1.

In FIG. 2, a dotted line A1 may denote a current path in a write operation and a chain thin line A2 may denote a current path in a read operation.

Referring to FIG. 2, current may flow through a selected bit line BL during a write operation. Thus, even though a cell to be written is selected by a selected word line WL, a magnetic field generated by current that flows through the selected bit line BL may affect the selected MTJ cell 18 as well as an unselected (e.g., adjacent) MTJ cell (not shown) connected to the selected bit line BL. Accordingly, data scheduled to be written to a target cell may inadvertently be written to the unselected (e.g., adjacent) MTJ cell, thereby causing erroneous data to be stored in the conventional magnetic memory device, which may be referred to as having a "low selectively".

SUMMARY OF THE INVENTION

An example embodiment of the present invention is directed to a magnetic memory device, including a transistor disposed within a given unit cell region and a magnetic tunneling junction (MTJ) element connected to the transistor, the MTJ element including an MTJ cell and first and second pad layers forming a magnetic field at first and second ends of the MTJ cell, the transistor including a drain connected to the first pad layer in the given unit cell region and a bit line, a source connected to the second pad layer in an adjacent unit cell region, and a gate connected to a word line corresponding to the given unit cell region.

Another example embodiment of the present invention is directed to a method of writing data into a magnetic memory device, including writing data into a magnetic tunneling junction (MTJ) element by polarizing a selected memory region connected to a word line, a first magnetic field at a first end of the MTJ element controlled by a first transistor corresponding to the selected memory region and a second magnetic field at a second end of the MTJ element controlled by a second transistor associated with an adjacent MJT element, the adjacent MJT element connected to the same word line as the MJT element.

Another example embodiment of the present invention is directed to a method of controlling a magnetic memory device, including applying a first current to a first portion of a magnetic tunneling junction (MTJ) element on a first path from a word line to the MTJ element and applying a second current to a second portion of the MTJ element on a second path from the word line to the MTJ element, each of the first and second currents lower than a current threshold, the current threshold being a minimum current for initiating a polarization of the MTJ element, and a sum of the first and second currents at least equal to the current threshold.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Figure 1:
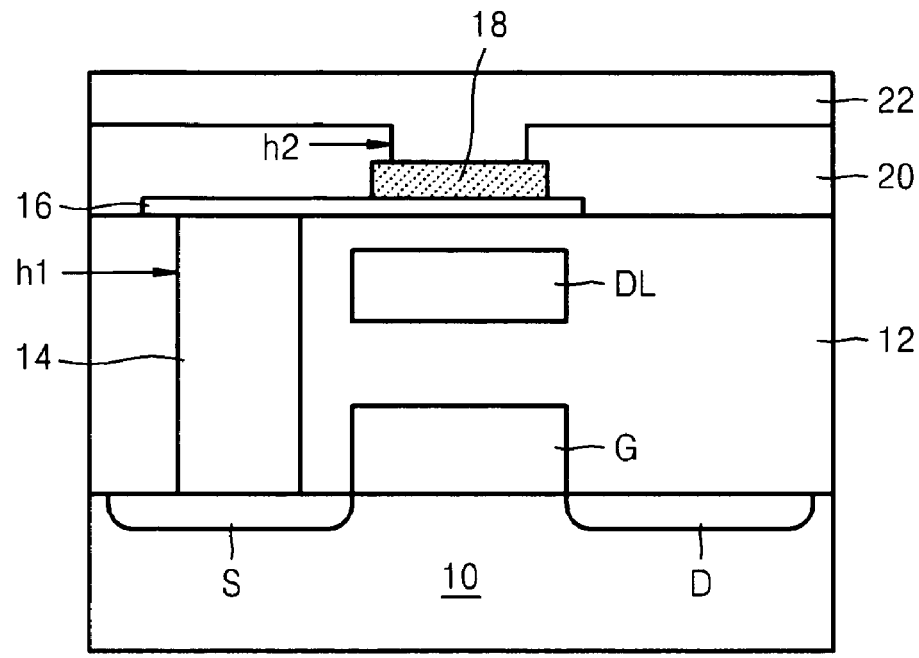
FIG. 1 is a cross-sectional view illustrating a conventional magnetic memory device.
Figure 2:
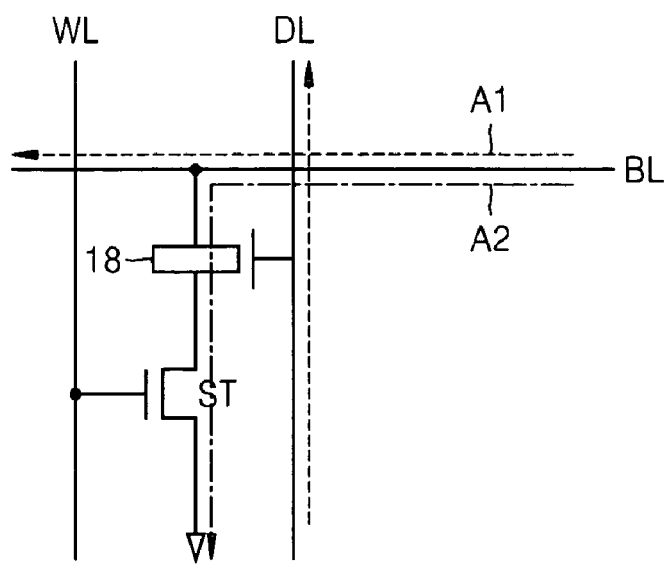
FIG. 2 illustrates a flow of current in write and read operations of the conventional magnetic memory device of FIG. 1.

Detailed illustrative example embodiments of the present invention are disclosed herein. However, specific structural and functional details disclosed herein are merely representative for purposes of describing example embodiments of the present invention. This invention may, however, be embodied in many alternate forms and should not be construed as limited to the example embodiments set forth herein.

Accordingly, while the invention is susceptible to various modifications and alternative forms, specific embodiments thereof are shown by way of example in the drawings and will herein be described in detail. It should be understood, however, that there is no intent to limit the invention to the particular forms disclosed, but on the contrary, the invention is to cover all modifications, equivalents, and alternatives falling within the spirit and scope of the invention. Like numbers refer to like elements throughout the description of the figures.

It will be understood that, although the terms first, second, etc. may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, example embodiments of the present invention will be explained in detail with reference to the accompanying drawings.

Figure 3:
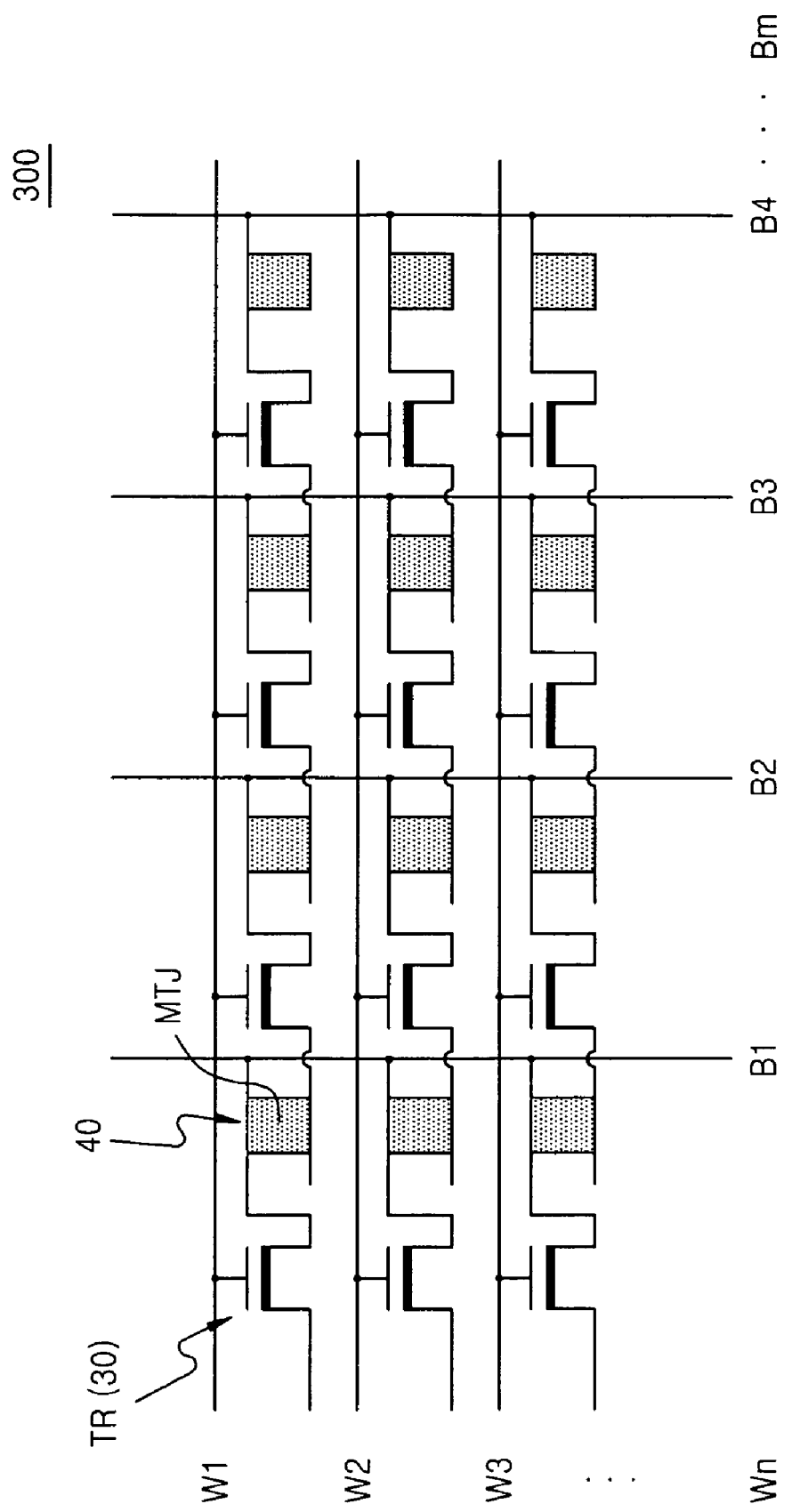
FIG. 3 is an equivalent circuit diagram of a memory device according to an example embodiment of the present invention.
Figure 4:
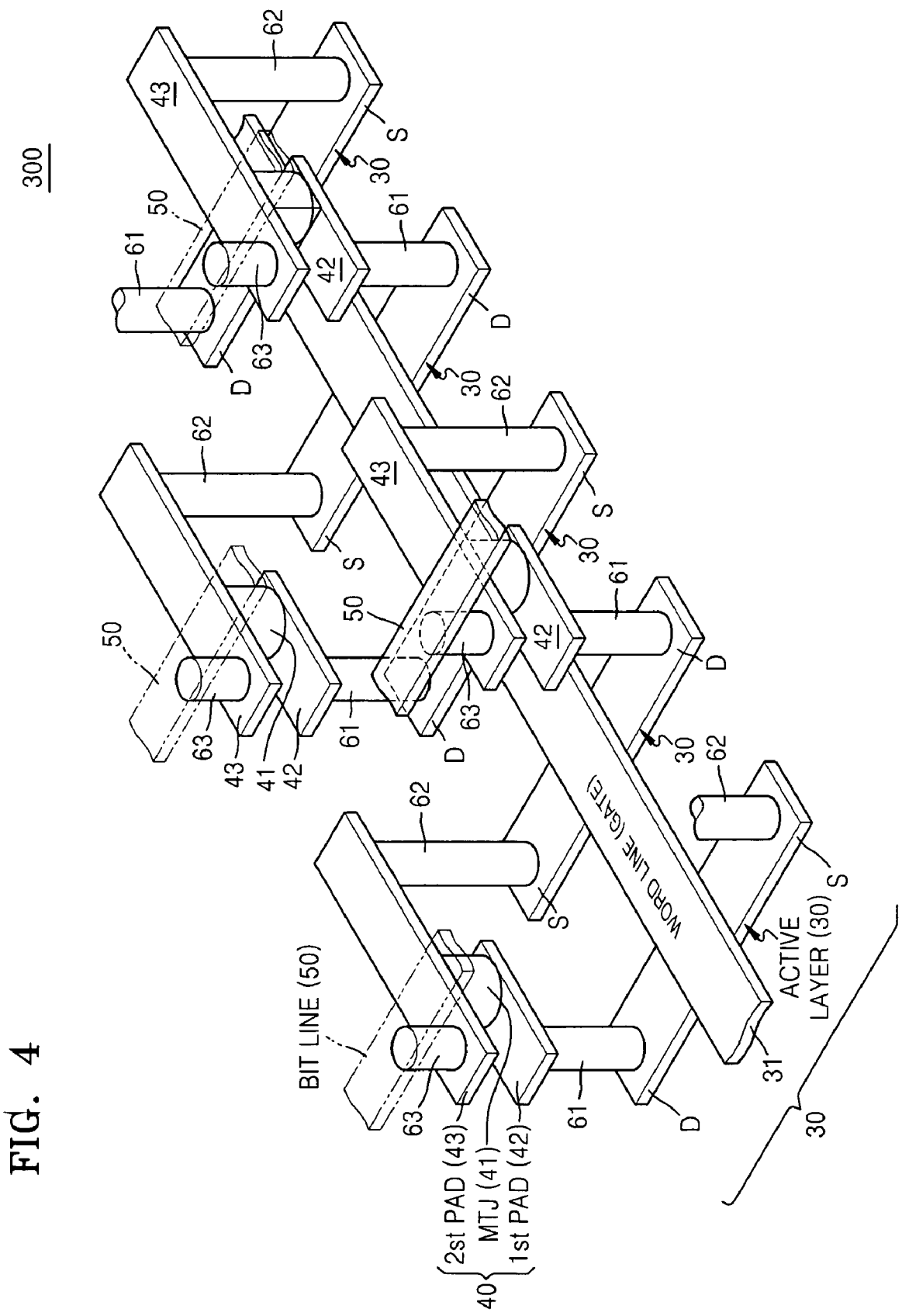
FIG. 4 is a cubic diagram of a schematic configuration of the memory device according to another example embodiment of the present invention.

FIG. 3 is an equivalent circuit diagram of a memory device 300 according to an example embodiment of the present invention. FIG. 4 is a cubic diagram of a schematic configuration of the memory device 300 according to another example embodiment of the present invention.

In the example embodiment of FIG. 3, bit lines B1, B2, B3, B4, . . . , and Bm in a latitudinal direction and word lines W1, W2, W3, . . . , and Wn in a longitudinal direction may be disposed on an X-Y matrix and a unit cell region may be defined by the bit lines and the word lines.

In the example embodiment of FIG. 3, a transistor 30 and an MTJ element 40 may be disposed in each unit cell region defined by the bit lines B1, B2, B3, B4, . . . , and Bm and the word lines W1, W2, W3, . . . , and Wn. The MTJ element 40 may include an MTJ cell 41 and first and second pad layers (e.g., denoted by reference numbers 42 and 43 in the example embodiment FIG. 4, described below), which may be formed at both sides (e.g., the top and bottom of FIG. 3) of the MTJ cell 41 forming a magnetic field required for polarization of the MTJ cell 41. An active layer of the transistor TR and the MTJ element 40 may be serially connected to each other in each unit cell region, and this connection structure may repeat for all unit cell regions within the memory device 300. Thus, each transistor TR having a gate connected to one of the word lines W1 to Wn and the MTJ element 40 may be repeatedly and serially connected to each other. A drain of the transistor 30 and a connection node of the MTJ cell 40 may be connected to adjacent bit lines B1 to Bm, and a source of each transistor may be electrically connected to the bit lines B1 to Bm through the MTJ element 40 in an adjacent unit cell region.

In the example embodiment of FIG. 4, active layers of the transistor 30 may be disposed in parallel. Adjacent active layers may include sources S and drains D, which cross one another in different directions. Plugs 62 and 63 may be vertically formed in the drains D and the sources S of two adjacent active layers 30. The first pad layer 42 and the second pad layer 43 of the MTJ element 40 may be disposed on each of the plugs 62 and 63. The opposing first and second pad layers 42 and 43 may be parallel to each other and the MTJ cell 41 may be disposed therebetween. The plug 63 may be formed on the second pad layer 43. The plug 63 may be connected to the bit line 50 on the second pad layer 43. In an example, thicknesses of the first and second pad layers 42 and 43 may be less than 100 nanometers (nm) and widths thereof may be less than 100 nm. In another example, the bit line 50 and the second pad layer 43, which may be adjacent to the bit line 50, may be spaced apart from each other by a gap of at least 300 nm.

Figure 5:
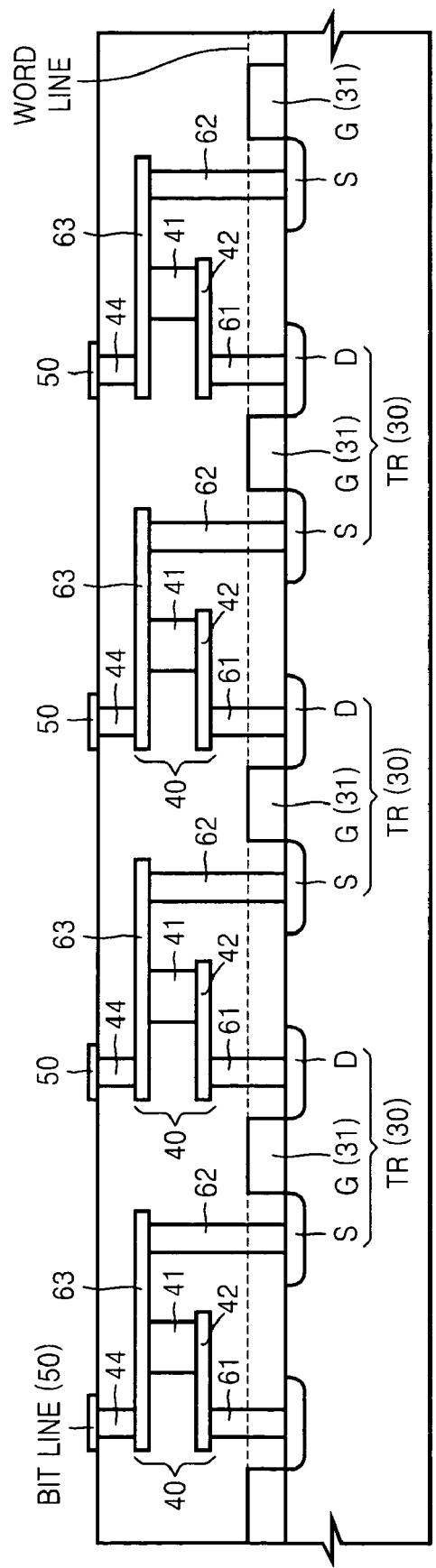
FIG. 5 is a schematic cross-sectional view illustrating a transistor and a magnetic tunneling junction (MTJ) element of the memory device of FIG. 4 according to another example embodiment of the present invention

FIG. 5 is a schematic cross-sectional view illustrating the transistor 30 and the MTJ element 40 of FIG. 4 according to another example embodiment of the present invention. As shown in the example embodiment of FIG. 5, the transistor 30 and the MTJ element 40 may be disposed in a "zigzag" shape. In FIG. 5, a gate G of each transistor may correspond to a single word line, as denoted by a dotted line. As illustrated in the example embodiment of FIG. 5, the transistor 30 and the MTJ element 40 may be serially connected to each other, such as in a repeating sequence of MTJ-TR-MTJ-, . . . , and -TR. A portion for connecting the source S and the MTJ element 40 may be connected to the bit line 50 through a plug 63.

Figure 6A:
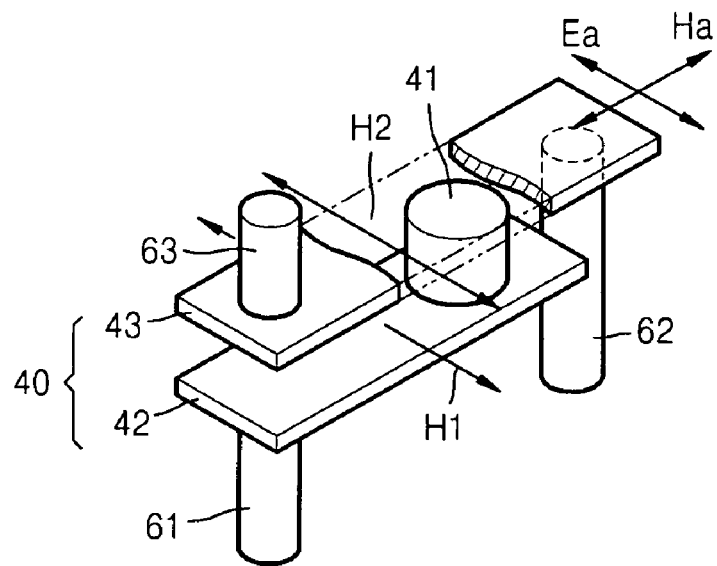
FIGS. 6A and 6B illustrate an extracted perspective view and a cross-sectional view, respectively, of the MTJ element of FIG. 5 according to another example embodiment of the present invention.
Figure 6B:
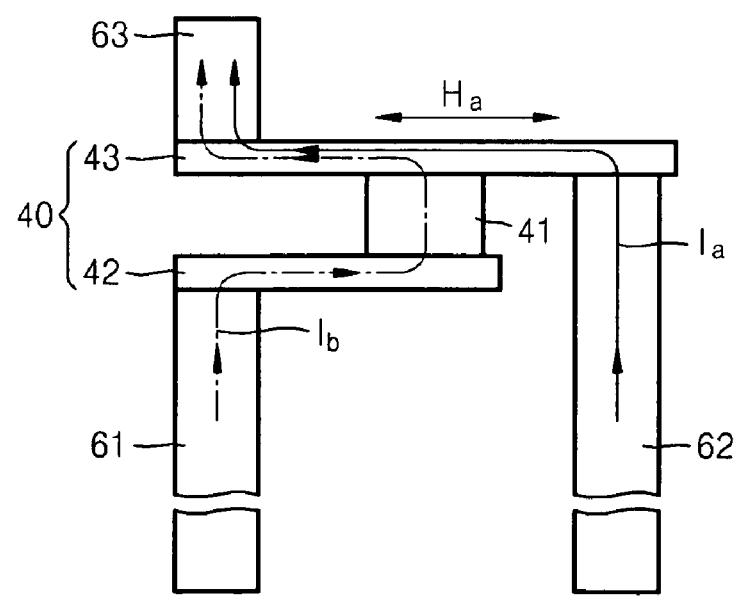

FIGS. 6A and 6B illustrate an extracted perspective view and a cross-sectional view, respectively, of the MTJ element 40 of the magnetic memory device 300 of FIGS. 3 and 4 according to another example embodiment of the present invention. In particular, FIGS. 6A and 6B illustrate a current path for writing data through the first and second pad layers 42 and 43.

In the example embodiments of FIGS. 6A and 6B, the MTJ cell 41 may be disposed between the first and second pad layers 42 and 43 (e.g., which may be positioned in parallel). The MTJ cell 41 may be disposed between a middle portion of the second pad layer 43 and a first end (e.g., a "right" end with respect to FIGS. 6A and 6B) of the first pad layer 42. The plug 63 to be connected to a bit line (not shown) and a plug 62 to be connected to a source (not shown) in another cell region (e.g., an adjacent cell region) may be disposed at both sides of the second pad layer 43. A plug 61 to be a drain of a transistor (not shown) may be disposed under a second end of the first pad layer 42. A current may flow through two paths $I_a$ and $I_b$. One of the two paths $I_a$ and $I_b$ may be a first path through a transistor, the first pad layer 42, the MTJ cell 40, and the second pad layer 43. The other of the two paths $I_a$ and $I_b$ may be a second path through a plug 62 connected to a transistor in another cell region (e.g., an adjacent cell region) and the second pad layer 43. Thus, a current which may facilitate data storage in the MTJ cell 41 may be a sum of the currents provided via the first and second paths $I_a+I_b$. The currents flowing along the two paths $I_a$ and $I_b$ may be formed at both sides (e.g., top and bottom with respect to FIGS. 6A and 6B) of the MTJ cell 41 and thus, a magnetic field required for the MTJ cell 41 (e.g., to store/read data) may have a relatively low current. Here, the magnetic field may be spaced apart from a bit line and a plug connected to the bit line. Thus, the magnetic field caused by the bit line may not affect an operation of the MTJ cell 41.

In the example embodiment FIGS. 6A and 6B, $H_a$ and $E_a$ may represent a hard axis direction and an easy axis direction of the MTJ cell 41, respectively. If magnetic polarization of the MTJ cell 41 is aligned in the easy axis $E_a$ direction, the alignment state may be maintained stably even after a magnetic field is reduced or removed. Alternatively, if magnetic polarization of the MTJ cell 41 may be aligned in the hard axis Ha direction, the alignment state may transition to its original state or may be inverted in the $E_a$ direction. Current may flow through the current paths $I_a$ and $I_b$ illustrated in FIG. 6B, or alternatively, in opposite directions with respect to the current paths $I_a$ and $I_b$. Magnetic fields H1 and H2 in the $E_a$ direction, which may affect a local region of the MTJ cell 41, may be generated around the first and second pad layers 42 and 43. Magnetic polarization of the MTJ cell 41 may be aligned in the $E_a$ direction by the magnetic fields H1 and H2. Here, polarization may not be inverted by the currents on paths $I_a$ or $I_b$, but rather may be inverted by a sum of the currents on paths $I_a$ and $I_b$. That is, the currents on paths $I_a$ and $I_b$ may be smaller than a threshold current required for polarization. The sum of the currents $I_a$ and $I_b$ may be larger than the threshold current.

Figure 7:
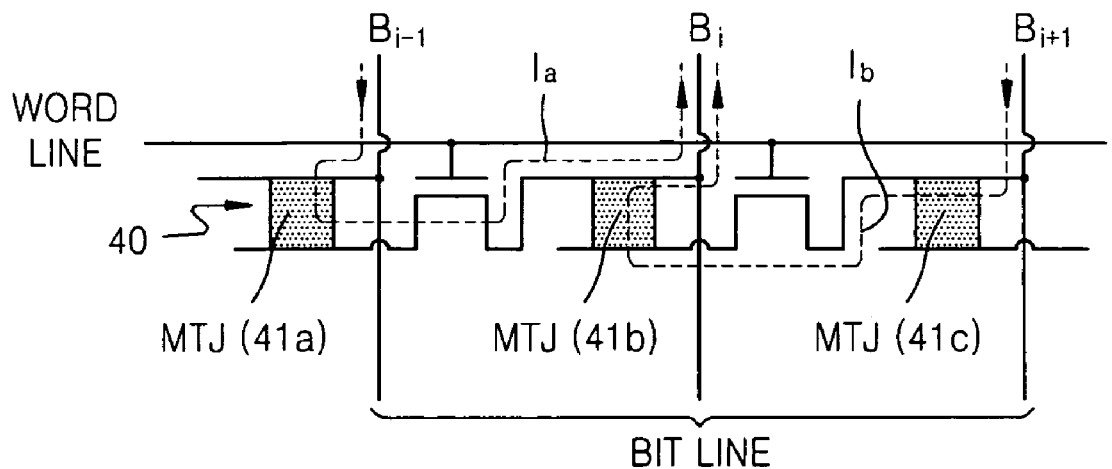
FIG. 7 is an equivalent circuit diagram illustrating a portion of the magnetic memory device of FIGS. 3 and 4 according to another example embodiment of the present invention.

FIG. 7 is an equivalent circuit diagram illustrating a portion of the magnetic memory device 300 of FIGS. 3 and 4 according to another example embodiment of the present invention.

In the example embodiment of FIG. 7, if data is written into the selected MTJ cell 40 of the memory device by a magnetic field, one word line and three bit lines may be selected. Data may be stored in the MTJ element 40 that is connected (e.g., directly connected) to a middle bit line.

In the example embodiment of FIG. 7, three bit lines $B_{i-1}$, $B_i$, and $B_{i+1}$ (e.g., where i may be a natural number) may be active, or permanently selected, if data is stored in an MTJ cell. An MTJ cell in which polarization occurs may be an MTJ cell (MTJb) in a unit cell region corresponding to the middle bit line $B_i$. If the middle bit line $B_i$ is grounded and a given current or voltage is applied to the bit lines $B_{i-1}$ and $B_{i+1}$ at both sides of the bit line $B_i$ when one word line is opened, the two current paths $I_a$ and $I_b$ may be generated. For example, a cell region corresponding to each bit line may be considered to be located at a "left" side of a bit line. Thus, a current on the first path $I_a$ may flow through a corresponding bit line Bi through a transistor TRa in a corresponding cell region and a pad layer at one side of the MTJ cell 40 via the MTJ cell 40a in an adjacent unit cell region (e.g., on the "left" of FIG. 7). A current on the second path $I_b$ may pass through the cell (MTJb) of the MTJ cell 40 via the bit line $B_{i+1}$ and the transistor TRb in an adjacent unit cell region (e.g., on the "right" of FIG. 7). Thus, polarization may occur in the MTJ cell 40 of the selected bit line due to the currents of the two paths $I_a$ and $I_b$ such that data may be stored in the MTJ cell 40. However, in an example, the currents may flow through only one path in the MTJ cell 40 of the bit lines at both sides of the selected bit line and polarization may thereby not occur due to the currents flowing therein.

Figure 8:
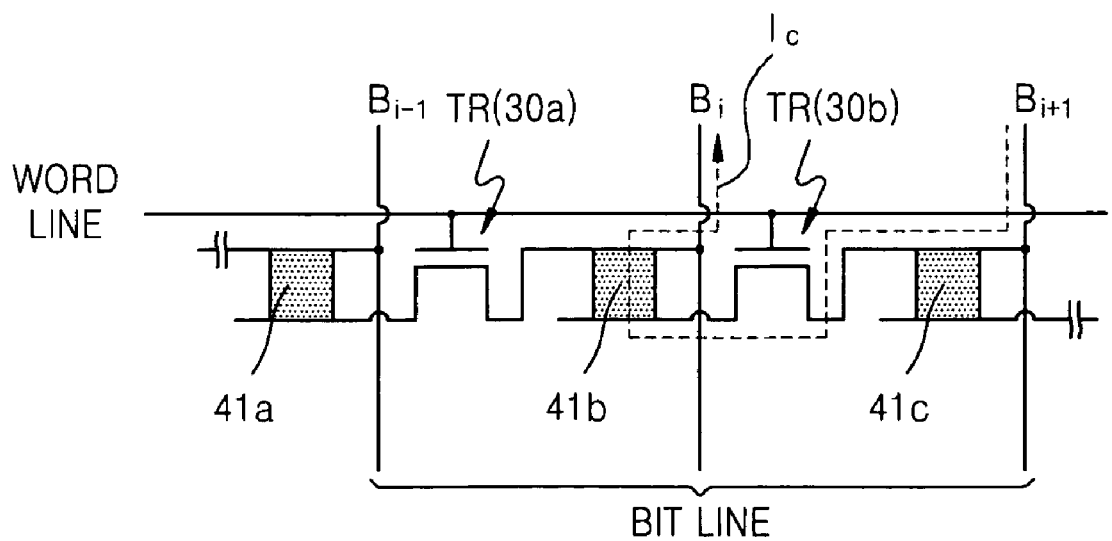
FIG. 8 is an equivalent circuit diagram illustrating another portion of the magnetic memory device of FIGS. 3 and 4 according to another example embodiment of the present invention.

FIG. 8 is an equivalent circuit diagram illustrating a portion of the magnetic memory device 300 of FIGS. 3 and 4 according to another example embodiment of the present invention. In particular, FIG. 8 illustrates a process of reading data within the memory device 300. For example, in order to obtain bit information from a given unit memory region, a corresponding bit line $B_i$ and a corresponding word line may be selected. Concurrently, a bit line $B_{i+1}$ of adjacent bit lines to which a drain of a corresponding transistor is connected (e.g., on the "right" of FIG. 8) may be selected. Thus, if a given voltage is applied to the two selected bit lines $B_i$ and $B_{i+1}$ when a corresponding word line is opened, a current $I_c$ that passes through the MTJ 41b in a corresponding unit cell region may be generated and bit information may be obtained based on a value of the current.

In another example embodiment of the present invention, a MTJ cell may be isolated from a bit line and a pad layer that forms a magnetic field may be provided at both sides of the MTJ cell.

In another example embodiment of the present invention, a magnetic memory device may control magnetic polarization of a free magnetic layer of an MTJ cell. Pad layers may be formed at both sides of the MTJ cell and paths of currents for forming a magnetic field in the MTJ cell may be divided into two transistors. Thus, data may be written without using a magnetic field generated in a bit line, but rather by using a magnetic field generated in the pad layers that may contact both sides of the MTJ cell. Thus, bit data may be written into a selected MTJ cell and bit data may be at least partially prevented from being inadvertently written into an unintended or unselected MTJ cell (e.g., such as an adjacent cell). Such a magnetic memory device may have a higher selectivity. Furthermore, two current paths may be generated so that currents may be divided between two (e.g., or more) transistors and a current load on each transistor may thereby be reduced.

In another example embodiment of the present invention, thicknesses of upper and lower electrode pad layers may be relatively low (e.g., less than 100 nm), and widths thereof may also be relatively low (e.g., less than 100 nm). Thus, an intensity of a magnetic field generated in each unit current of the pad layers may be increased. Thus, a current used to record bit data may be reduced. As a result, a driving power of the magnetic memory device may be reduced.

Example embodiments of the present invention being thus described, it will be obvious that the same may be varied in many ways. For example, in other example embodiments of the present invention, a digit line may be adjusted and/or the first and second pad layers 42 and 43 may be configured as multi-layers. Also, it is understood that a material used in forming the first and second pad layers 42 and 43 may include any well-known and appropriate material as would be classified by one of ordinary skill in the art. In addition, a shielding means (not shown) for improving a blocking effect of a magnetic field generated from a bit line between the bit line and the pad layer may be further provided.

Further, it is understood that the above-described first and second logic levels may correspond to a higher level and a lower logic level, respectively, in an example embodiment of the present invention. Alternatively, the first and second logic levels/states may correspond to the lower logic level and the higher logic level, respectively, in other example embodiments of the present invention.

Such variations are not to be regarded as a departure from the spirit and scope of example embodiments of the present invention, and all such modifications as would be obvious to one skilled in the art are intended to be included within the scope of the following claims.

What is claimed is:

1. A magnetic memory device comprising:
a transistor disposed within a given unit cell region; and
a magnetic tunneling junction (MTJ) element connected to the transistor,
the MTJ element including,
an MTJ cell, and
first and second pad layers forming a magnetic field at first and second ends of the MTJ cell, the second pad layer connected to a bit line,
the transistor including,
a drain connected to the first pad layer in the given unit cell region,
a source connected to a bit line via a second pad layer in an MTJ element in an adjacent unit cell region, and
a gate connected to a word line corresponding to the given unit cell region, a transistor in the adjacent unit cell region connected to the word line.

2. The magnetic memory device of claim 1, wherein thicknesses of the first and second pad layers are less than 100 nanometers (nm).

3. The magnetic memory device of claim 1, wherein the bit line and the MTJ cell are spaced apart from each other by at least 300 nm.

4. A method of writing data into a magnetic memory device, comprising:
writing data into a magnetic tunneling junction (MTJ) element by polarizing a selected memory region connected to a word line, a first magnetic field at a first end of the MTJ element controlled by a first transistor corresponding to the selected memory region and a second magnetic field at a second end of the MTJ element controlled by a second transistor associated with an adjacent MJT element, a gate of the second transistor connected to the same word line as a gate of the first transistor.

5. The method of claim 4, wherein the first magnetic field controlled by the first transistor is based on a first current passing through the first transistor, and the second magnetic field controlled by the second transistor is based on a second current passing through at least the second transistor of the adjacent MJT element.

6. The method of claim 5, wherein a sum of the first and second currents has a value at least equal to a minimum threshold current required to polarize a given MTJ element, and each of the first and second currents is less than the minimum threshold current.

7. A method of controlling a magnetic memory device, comprising:
opening a word line connected to a first transistor and a second transistor, the first transistor providing a gate between a first magnetic tunneling junction (MTJ) element and a third MTJ element, the second transistor providing a gate between a second MTJ element and the third MTJ element;
applying a first current to the first MTJ element on a first path from a first bit line to the first MTJ element; and
applying a second current to the second MTJ element on a second path from a second bit line to the second MTJ element, each of the first and second currents lower than a current threshold, the current threshold being a minimum current for initiating a polarization of the third MTJ element, and a sum of the first and second currents at least equal to the current threshold.

8. The method of claim 7, wherein the first current energizes a first end of the third MTJ element and the second current energizes a second end of the third MTJ element.

9. A method of writing data into the magnetic memory device of claim 1, the method comprising:
writing data into the MTJ element by polarizing a selected memory region connected to the word line, a first magnetic field at the first end of the MTJ element controlled by a first transistor corresponding to the selected memory region and a second magnetic field at the second end of the MTJ element controlled by a second transistor associated with an adjacent MJT element, the second transistor connected to the same word line as the MJT element.

10. A method of controlling the magnetic memory device of claim 1, the method comprising:
opening the word line connected to the transistor and the transistor in the adjacent unit cell region;
applying a first current to the MTJ cell on a first path from a first bit line to the MTJ cell; and
applying a second current to the MTJ element on a second path from a second bit line to the MTJ element, each of the first and second currents lower than a current threshold, the current threshold being a minimum current for initiating a polarization of the MTJ element, and a sum of the first and second currents at least equal to the current threshold.

* * * * *